(12) United States Patent
Kajiura et al.

(10) Patent No.: US 10,271,443 B2
(45) Date of Patent: Apr. 23, 2019

(54) ANCHORING STRUCTURE FOR ANNULAR MEMBER AND ELECTRONIC KEY (71) Applicant: DENSO CORPORATION, Kariya, Aichi-pref. (JP)

(72) Inventors: Shinji Kajiura, Kariya (JP); Hikaru Imamura, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 27 days.

(21) Appl. No.: 15/557,923

(22) PCT Filed: Mar. 17, 2016

(86) PCT No.: PCT/JP2016/001536
§ 371 (c)(1),
(2) Date: Sep. 13, 2017

(87) PCT Pub. No.: WO2016/157793
PCT Pub. Date: Oct. 6, 2016

(65) Prior Publication Data
US 2018/0063976 A1 Mar. 1, 2018

(30) Foreign Application Priority Data
Mar. 31, 2015 (JP) .................................. 2015-073649

(51) Int. Cl.
*H05K 5/02* (2006.01)
*E05B 49/00* (2006.01)
(Continued)

(52) U.S. Cl.
CPC ........... *H05K 5/0221* (2013.01); *A44B 15/00* (2013.01); *E05B 19/04* (2013.01); *E05B 49/00* (2013.01); *H05K 5/03* (2013.01); *G07C 9/00944* (2013.01)

(58) Field of Classification Search
CPC ................................................... H05K 5/0221
(Continued)

(56) References Cited

U.S. PATENT DOCUMENTS

2007/0220936 A1* 9/2007 Miyata .................. E05B 19/043
70/408
2013/0161051 A1* 6/2013 Imamura .............. H05K 5/0217
174/50

FOREIGN PATENT DOCUMENTS

JP 4673776 B2 4/2011
JP 2013133658 A 7/2013

* cited by examiner

*Primary Examiner* — Stanley Tso
(74) *Attorney, Agent, or Firm* — Harness, Dickey & Pierce, P.L.C.

(57) ABSTRACT

An anchoring structure for an annular member includes a housing including a first casing and a second casing, and the annular member. The annular member is partially interposed between the first casing and the second casing. The annular member includes an external member that protrudes to an outside of the housing, and an internal member connected to the external member and located on an inside of the housing. The first casing includes a first engagement portion into which a first end of the internal member is inserted, the first engagement portion limiting the first end from moving in a direction away from the first casing. The first casing includes a second engagement portion limiting a second end of the internal member from moving in the direction away from the first casing while the first end of the internal member is engaged with the first engagement portion.

6 Claims, 12 Drawing Sheets (51) Int. Cl.
    *E05B 19/04*     (2006.01)
    *H05K 5/03*     (2006.01)
    *A44B 15/00*     (2006.01)
    *G07C 9/00*     (2006.01)

(58) Field of Classification Search
    USPC .......................................................... 174/559
    See application file for complete search history.

ANCHORING STRUCTURE FOR ANNULAR MEMBER AND ELECTRONIC KEY

CROSS REFERENCE TO RELATED APPLICATIONS

This application is a U.S. National Phase Application under 35 U.S.C. 371 of International Application No. PCT/JP2016/001536 filed on Mar. 17, 2016 and published in Japanese as WO 2016/157793 A1 on Oct. 6, 2016. This application is based on and claims the benefit of priority from Japanese Patent Application No. 2015-073649 filed on Mar. 31, 2015. The entire disclosures of all of the above applications are incorporated herein by reference.

TECHNICAL FIELD

The present disclosure relates to an anchoring structure for an annular member that can be applied to a vehicular electronic key for opening and closing a door of a vehicle from an outside of the vehicle, for example, and an electronic key that includes the anchoring structure for the annular member.

BACKGROUND ART

In a general keychain, a key ring to which a ring, a string or the like is attached is sometimes formed integrally with the keychain by resin, rubber or the like. The key ring may not have enough strength against a high tension suddenly exerted on the keychain. A screw with a ring may be screwed to a keychain such as a mascot doll made of resin, rubber or the like. Tensile strength of this kind of keychain also may not be high.

An electronic key for a vehicle (portable device) typically includes a housing (a container constituted by a housing body and a cover) in which a wireless communication device for a key is accommodated. The housing includes a hole, a ring or the like to which a strap or the like is attached for limiting the electronic key for a vehicle from dropping from hands.

In such electronic key for a vehicle, an anchoring structure (snap-fit structure) is often used, in which a detachment of the housing body from the cover is limited by an elastic deformation of a holding rib having a hook portion. According to an electronic key for a vehicle in which the anchoring structure is used, when a battery located on an inside is required to be changed, the cover can be easily removed by exerting a force on an engagement surface in an opposite direction from an engaging direction, and accordingly the battery can be easily changed.

In recent years, an electronic key for a vehicle is proposed (refer to Patent Document 1), in which decoration parts are inserted into a housing body from a lateral surface such that the decoration parts are not disengaged from the electronic key by an outside force.

In this technology, a fixation portion of long decoration parts is joined to the housing body from the lateral surface (in a direction perpendicular to an engagement direction of the housing body and the cover), and a strength of the decoration parts against a twisting force is improved by inserting the fixation portion of the decoration parts into a groove of the lateral surface.

In the above-described technology, the strength against the twisting force or the like is improved. However, when the key ring is interposed between a pair of casings and a part of the key ring protrudes from the lateral surface of the housing to define some space between the lateral surface of the housing and the key ring, it may be difficult to improve the tensile strength and the strength against the twisting force just by using the above-described technology.

That is, when a part of the key ring having an arc shape protrudes from the lateral surface of the housing constituted by the housing body and the cover, the key ring may be detached from the housing body (accordingly, the housing) by an outside force in a direction in which the key ring is pulled or twisted.

PRIOR ART DOCUMENT

Patent Document

Patent Document 1: JP 2013-133658 A

SUMMARY OF THE INVENTION

In consideration of the above-described points, it is an objective of the present disclosure to provide an anchoring structure for an annular member and an electronic key which are capable of limiting a disconnect of the annular member protruding from a housing.

An anchoring structure for an annular member according to an aspect of the present disclosure includes: a housing including a first casing and a second casing which are engaged and integrated with each other; and the annular member. A part of the annular member is interposed between the first casing and the second casing, and the annular member is anchored to the housing and protrudes from the housing. The annular member includes: an external member that protrudes to an outside of the housing to define a gap between the external member and the housing; and an internal member that is connected to the external member and is located on an inside of the housing. The first casing includes a first engagement portion that has a shape into which a first end of the internal member is inserted, the first engagement portion limiting the first end of the internal member from moving in a direction away from the first casing. The first casing includes a second engagement portion limiting a second end of the internal member which is opposite from the first end from moving in the direction away from the first casing while the first end of the internal member is engaged with the first engagement portion.

Figure 10:
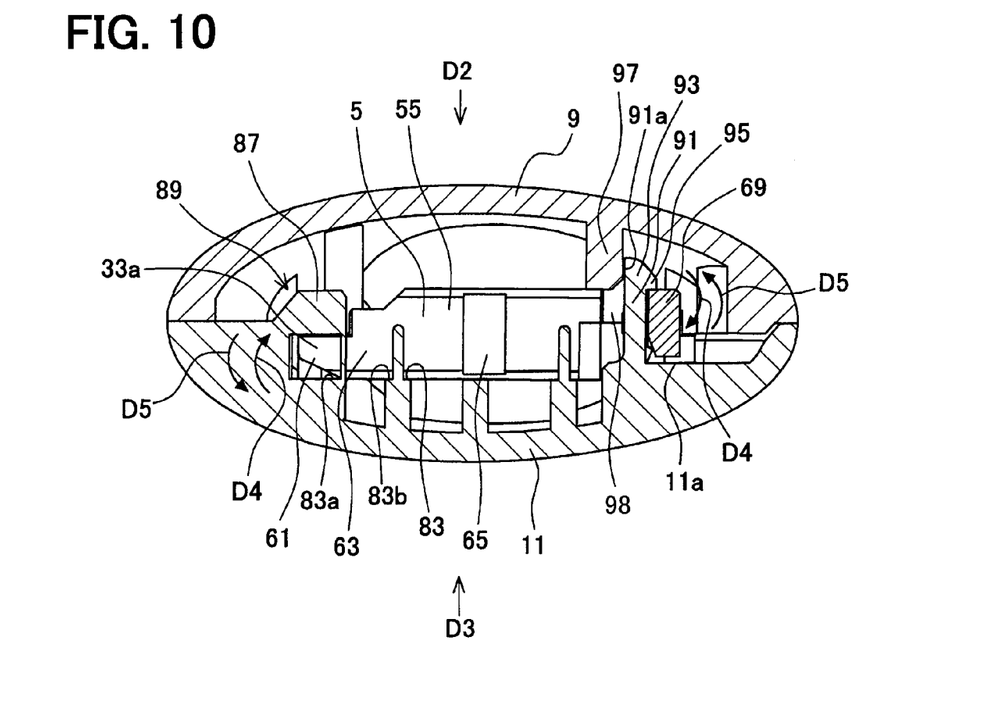
FIG. 10 is a cross-sectional diagram taken along X-X line of FIG. 9.

Accordingly, when a clockwise twisting force indicated by an arrow D4 in FIG. 10 is exerted on the annular member, a rotation of the first end of the annular member is limited by the first engagement portion of the first casing, and a rotation of the second end opposite from the first end of the annular member is limited by the first casing, for example. According to this, the clockwise rotation of the annular member is limited.

When a counterclockwise twisting force indicated by an arrow D5 in FIG. 10 is exerted on the annular member, the first end side of the annular member is stopped by the first casing, for example, and accordingly the rotation of the annular member is limited. A rotation of the other side of the annular member is stopped by the second engagement portion. Accordingly, the counterclockwise rotation of the annular member is limited.

That is, according to the configurations of the present disclosure, the annular member is not likely to drop from the first casing (housing), and the first casing and the second casing are not likely to be disengaged even when the twisting force is exerted on the annular member.

The present disclosure has a remarkable effect that the annular member is limited from dropping from the housing even when an outside force is exerted on the annular member joined to the housing so as to protrude from the housing.

EMBODIMENTS FOR EXPLOITATION OF THE INVENTION

Hereinafter, multiple embodiments for implementing the present invention will be described referring to drawings. In the respective embodiments, a part that corresponds to a matter described in a preceding embodiment may be assigned the same reference numeral, and redundant explanation for the part may be omitted. When only a part of a configuration is described in an embodiment, another preceding embodiment may be applied to the other parts of the configuration. The parts may be combined even if it is not explicitly described that the parts can be combined. The embodiments may be partially combined even if it is not explicitly described that the embodiments can be combined, provided there is no harm in the combination.

Hereinafter, embodiments of the present disclosure will be described referring to the drawings. An example of an electronic key for a vehicle is described as an electronic key that includes an anchoring structure for an annular member.

First Embodiment

First, a whole structure of an electronic key for a vehicle according to a first embodiment is described.

Figure 1:
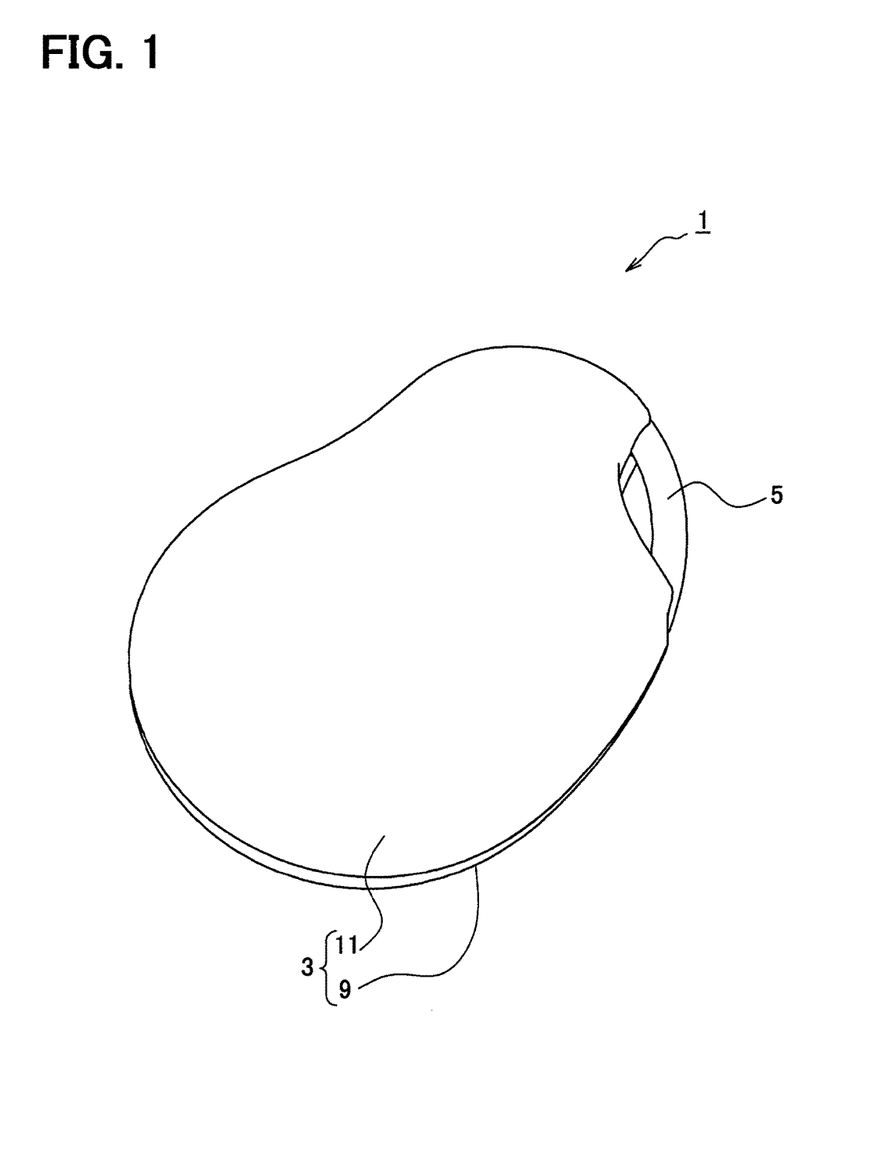
FIG. 1 is a perspective view illustrating an electronic key for a vehicle according to a first embodiment of the present disclosure.

An electronic key 1 for a vehicle according to the first embodiment includes a housing 3 that has a shape (bean shape) mainly formed by a curved surface, and a key ring 5 that is an annular member attached to the housing 3, a part of the key ring 5 protruding to an outside of the housing 3, as shown in FIG. 1.

The housing 3 is a container that accommodates a wireless communication device 7 for a key (see FIG. 2) communicating with a wireless communication device for a vehicle provided in a vehicle by a wireless radio wave, and the housing 3 includes a second casing 9 (casing B) that is a housing body in which the wireless communication device 7 for a key is provided and a first casing 11 (casing A) that is a lid member attached to the second casing 9 to cover the second casing 9.

Figure 2:
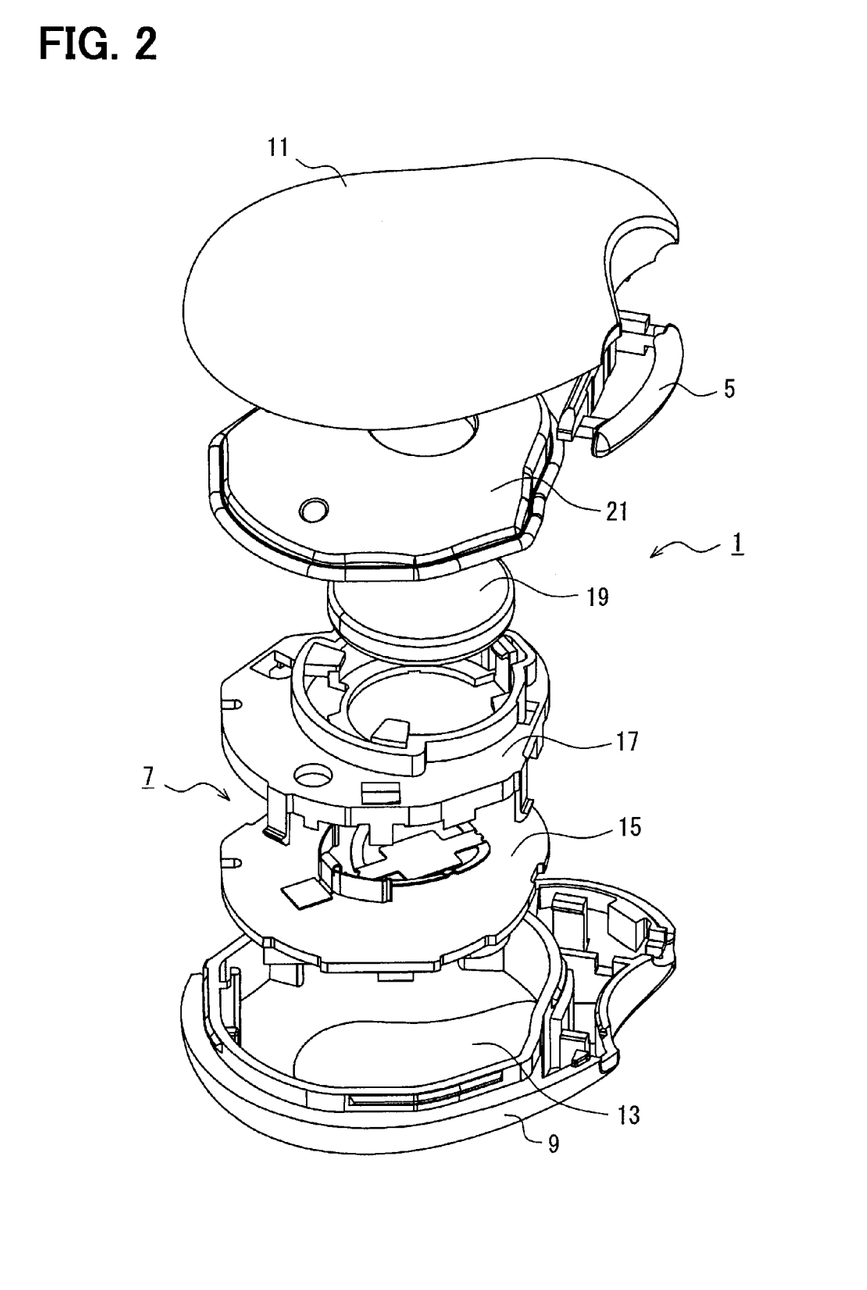
FIG. 2 is an explosive perspective view illustrating the electronic key for a vehicle according to the first embodiment.

As shown in FIG. 2, on a central region 13 of the second casing 9 which has a recess shape, a circuit board 15 of the wireless communication device 7 for a key, a battery holder 17, a battery 19, and a rubber cover 21 (waterproof rubber) are stacked in this order so as to be interposed between the first casing 11 and the second casing 9.

The first casing 11, the second casing 9, and the key ring 5 are molded products (e.g. products made by injection molding) made of a thermoplastic such as polycarbonate (PC), polyethylene terephthalate (PET), or poly(methyl methacrylate) (PMMA). A surface processing such as painting or printing is performed to the first casing 11, the second casing 9, and the key ring 5 to have specific shapes, designs, and colors. A metal material (e.g. iron) may be used as the key ring 5.

Figure 3:
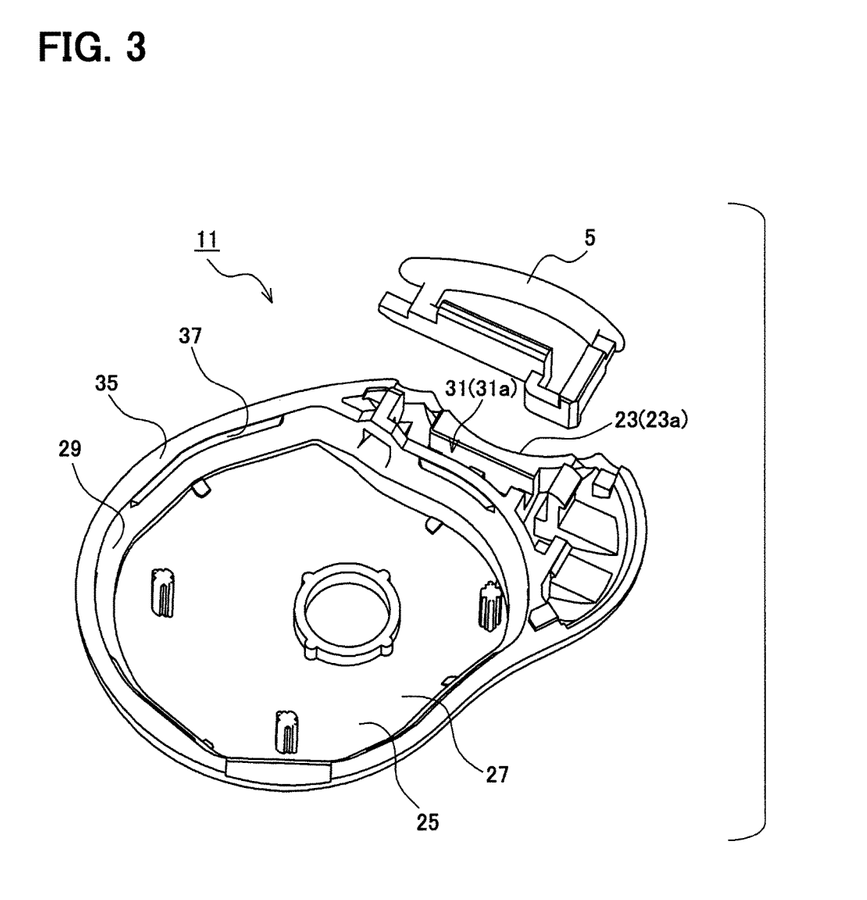
FIG. 3 is a perspective view illustrating a first casing and a key ring according to the first embodiment.
Figure 4:
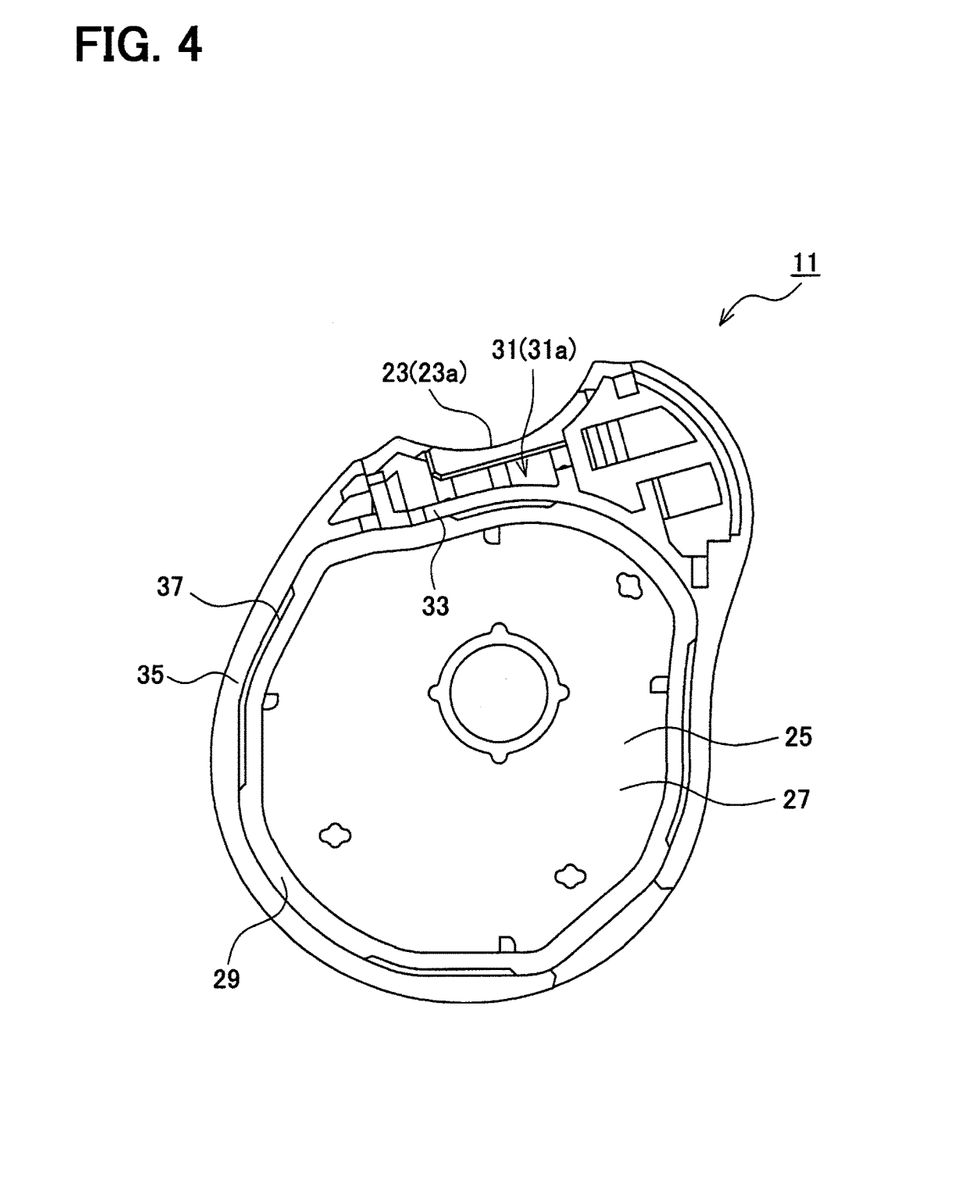
FIG. 4 is a plan view illustrating an opening side of the first casing according to the first embodiment.

Next, configurations of each component of the electronic key 1 for a vehicle will be described in more detail. As shown in FIGS. 3 and 4, the first casing 11 (lid member) has a plate shape and is attached to the second casing 9 to constitute the housing 3, and an outer periphery of a part of the first casing 11 to which the key ring is attached is a concave portion 23 (a first concave portion 23a of the first casing 11) that is smoothly curved in a concave shape.

The first casing 11 includes a central region 27 including a bottom wall 25 that has a concave shape, a rim portion 29, a fixation structure 31 (a first fixation structure 31a of the first casing 11) to which the key ring 5 is fixed, and a partition wall 33 that partitions the central region 27 from the fixation structure 31. The rim portion 29 has an annular shape and encircles the central region 27. The rim portion 29 is higher than the bottom wall 25 and extends in a single plane.

An outer rim portion 35 is provided on an outer peripheral side of the rim portion 29. The outer rim portion 35 is higher than the rim portion 29 and extends in a single plane. Multiple engaging claws 37 for engaged with the second casing 9 are provided on an inner peripheral surface of the outer rim portion 35.

Figure 5:
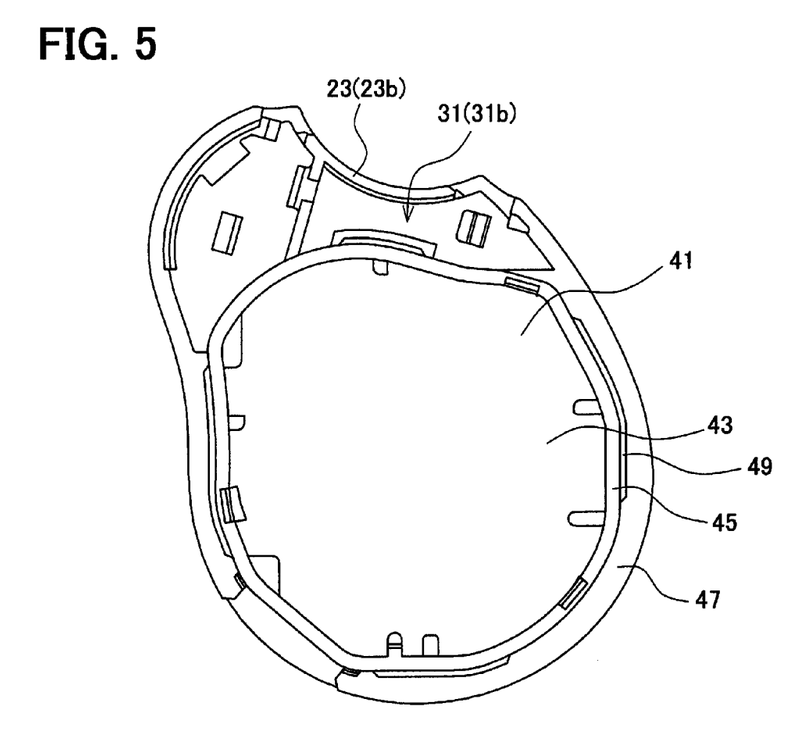
FIG. 5 is a plan view illustrating an opening side of a second casing according to the first embodiment.
Figure 6:
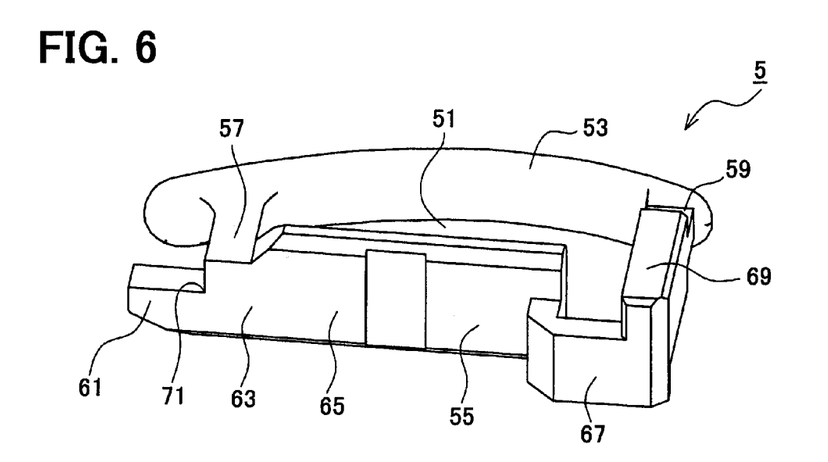
FIG. 6 is a perspective view illustrating the key ring according to the first embodiment.

As shown in FIGS. 5 and 2, the second casing 9 (housing body) has a plate shape and is engaged with the first casing 11 to constitute the housing 3, and outer periphery of a part of the second casing 9 to which the key ring 5 is attached is the concave portion 23 (a second concave portion 23b of the second casing 9) that is smoothly curved in a concave shape.

The second casing 9 includes a central region 43 having a bottom wall 41 on which the above-described components such as the circuit board 15 are stacked, and a rim portion 45 that has an annular shape extending in a single plane. The rim portion 45 encircles the central region 43 and is higher than the bottom wall 41.

An outer rim portion 47 that is lower than the rim portion 45 and extends in a single plane is provided on an outer periphery of the rim portion 45. Multiple engaging claws 49 for engaged with the first casing 11 (engaging claw 37) are provided on an outer peripheral surface of the rim portion 45.

A fixation portion 31 (a second fixation structure 31b of the second casing 9) to which the key ring 5 is fixed is provided between the rim portion 45 and the second concave portion 23b.

As shown in FIGS. 6 and 7A to 7F, the key ring 5 is an annular member having a space 51 at a center part and includes an external member 53 located on an outside of the housing 3, an internal member 55 located on an inside of the housing 3, a first linkage portion 57, and a second linkage portion 59. The external member 53 has a circular column shape curved in an arc shape. The internal member 55 has a curved long board shape. The first linkage portion 57 links one end side (left side of FIG. 6) of the external member 53 with one end (first end) side of the internal member 55. The second linkage portion 59 connects the other end side (right side of FIG. 6) of the external member 53 with the other end side of the internal member 55. The other end side of the internal member 55 may be a second end side that is an opposite side from the first end side of the internal member 55.

The internal member 55 includes a tip side engagement portion 61, an angular portion 63, a center board portion 65, a linkage portion 67, and a back side engagement portion 69. The tip side engagement portion 61 is an engaging portion for fixing the key ring 5 to a first engagement portion 89 (see FIG. 8) of the first casing 11 and has a convex shape protruding from the first linkage portion 57 toward the one end side (left side of FIG. 6; tip side). The tip side engagement portion 61 has a board shape, and a lower part is obliquely cut off such that a width of the tip side decreases.

A corner of the tip side engagement portion 61 may be chamfered to have a smooth curved outline so as to be easily engaged to (enter) a groove (tip groove) 83a (see FIG. 8) during engaging the key ring 5.

The angular portion 63 is integrated with the first linkage portion 57, and a width of the angular portion 63 (width in right-left direction of FIG. 7D) is larger than that of the tip side engagement portion 61. A base side of the tip side engagement portion 61 is vertically bent at the angular portion 63, and accordingly a recess portion 71 that is a recess vertically bent.

The center board portion 65 has a board shape whose width is larger than the angular portion 63, and the center board portion 65 extends toward the other end side (right side of FIG. 6, rear end side) so as to be on the same plane as the tip side engagement portion 61. The linkage portion 67 has a board shape whose width is smaller than the center board portion 65 and is bent in an L-shape. In detail, the linkage portion 67 is offset to one side (lower side of FIG. 6) from a back end portion of the center board portion 65 and protrudes from the back end portion of the center board portion 65 vertically outward (downward in FIG. 7C). The linkage portion 67 is bent at a right angle toward the back side engagement portion 69 to be connected to the back side engagement portion 69.

The back side engagement portion 69 is an engagement portion for fixing the key ring 5 to the first casing 11 and is connected to the linkage portion 67, and the back side engagement portion 69 has a board shape extending perpendicularly to the center board portion 65.

A width (width in right-left direction of FIG. 7D) of the back side engagement portion 69 is smaller than the center board portion 65, and an opposite side from the part connected to the linkage portion 67 is connected to the second linkage portion 59. A width (width in right-left direction in FIG. 7D) of the first linkage portion 57 is smaller than that of the angular portion 63, and a width of the second linkage portion 59 is smaller than that of the back side engagement portion 69.

Accordingly, the external member 53, the first linkage portion 57, the angular portion 63, the center board portion 65, the linkage portion 67, the back side engagement portion 69, and the second linkage portion 59 are connected to shape an annular shape and constitute an integrated member. That is, the key ring 5 has an annular shape encircling the space 51.

Figure 7A:
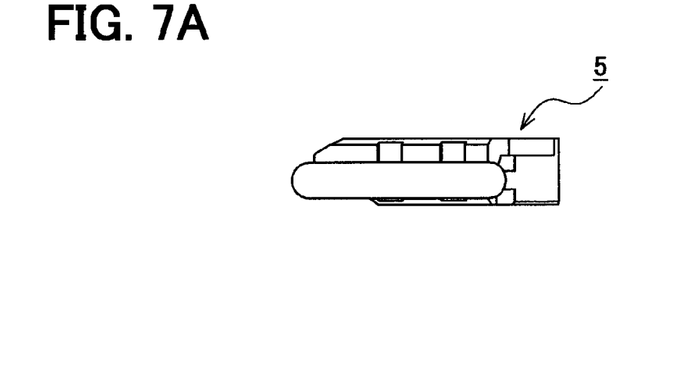
FIG. 7A is a diagram illustrating the key ring according to the first embodiment.
Figure 7B:
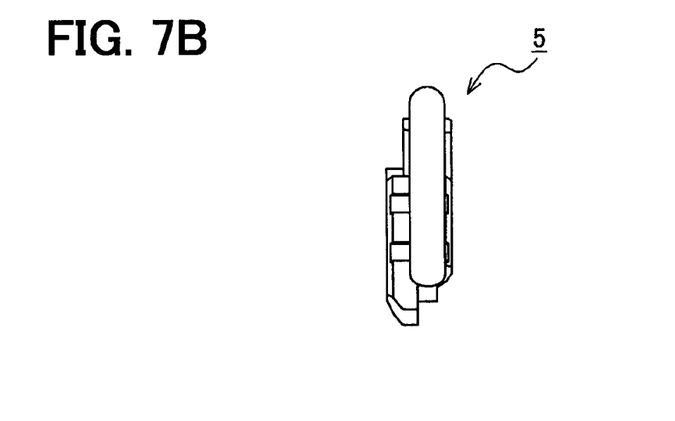
FIG. 7B is a side view illustrating the key ring according to the first embodiment.
Figure 7C:
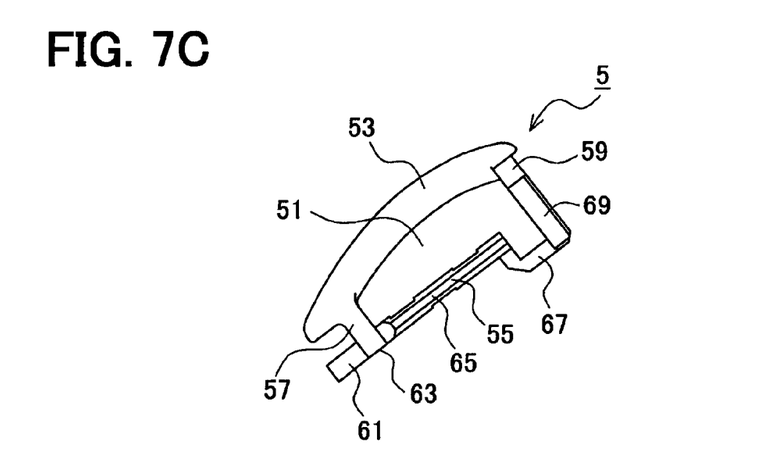
FIG. 7C is a front view illustrating the key ring according to the first embodiment.
Figure 7D:
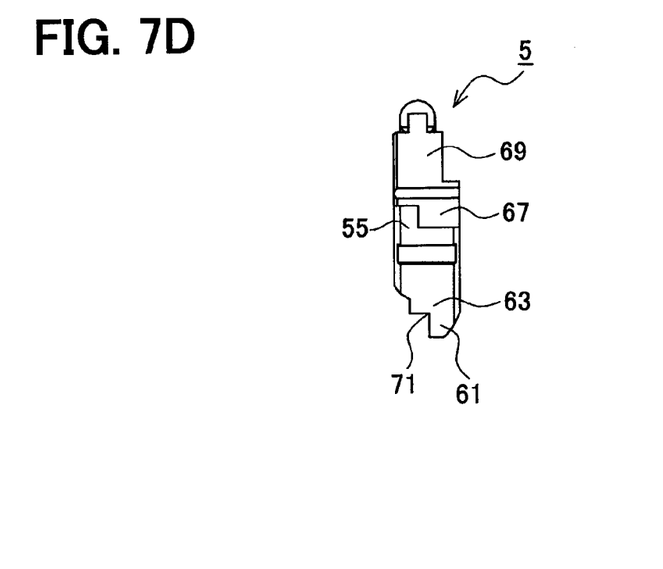
FIG. 7D is a side view illustrating the key ring according to the first embodiment.
Figure 7E:
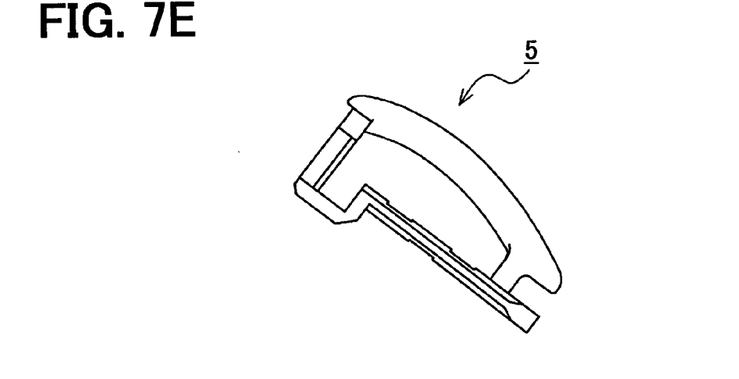
FIG. 7E is a rear view illustrating the key ring according to the first embodiment.
Figure 7F:
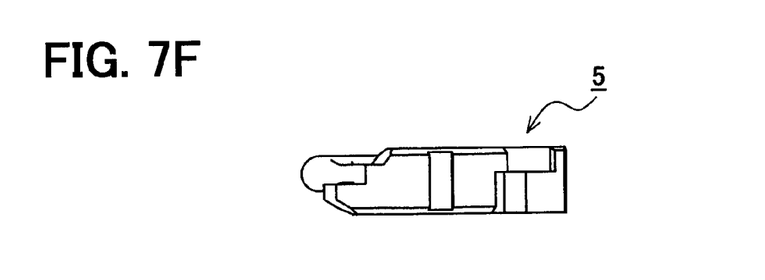
FIG. 7F is a bottom view illustrating the key ring according to the first embodiment.

In FIG. 7D, a right side of the internal member 55 is engaged with (inserted into) the first fixation structure 31a of the first casing 11, and a left side of the internal member 55 is engaged with (inserted into) the second fixation structure 31b of the second casing 9.

Next, the fixation structure 31 for the key ring 5 which fixes the key ring 5 to the housing 3 will be described in detail below referring to FIGS. 8 to 11.

Figure 8:
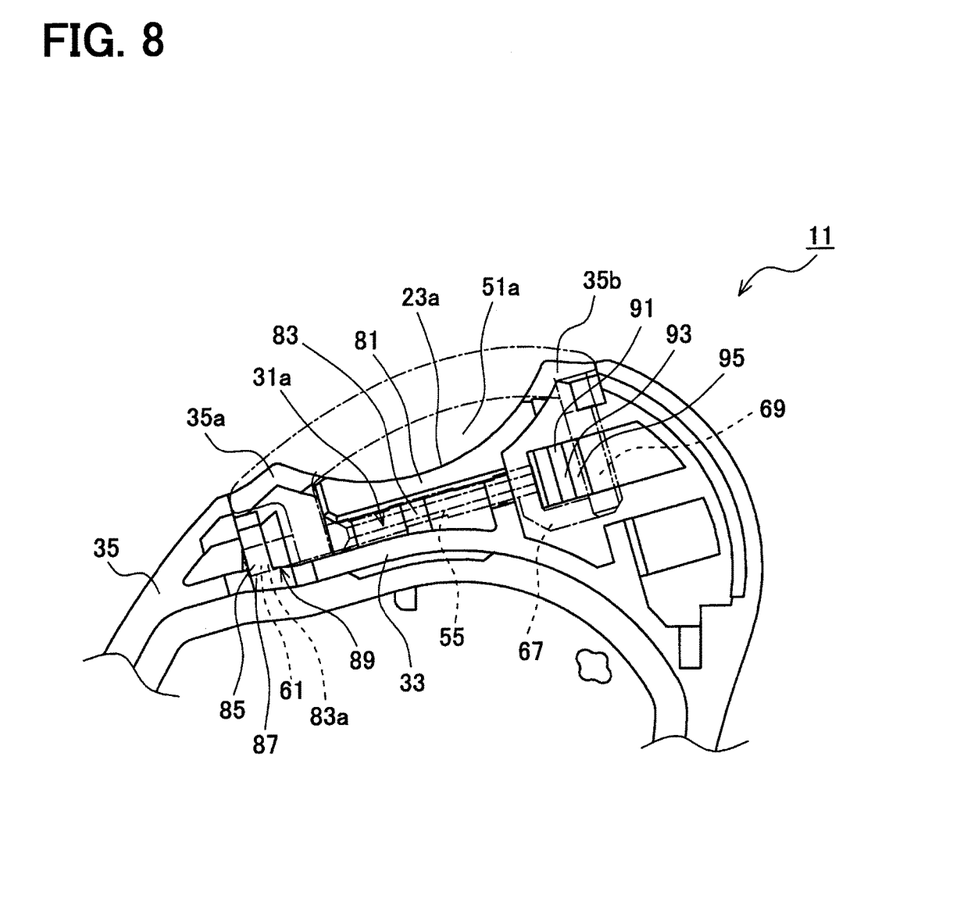
FIG. 8 is a plan view illustrating a fixing structure of the first casing according to the first embodiment.
Figure 9:
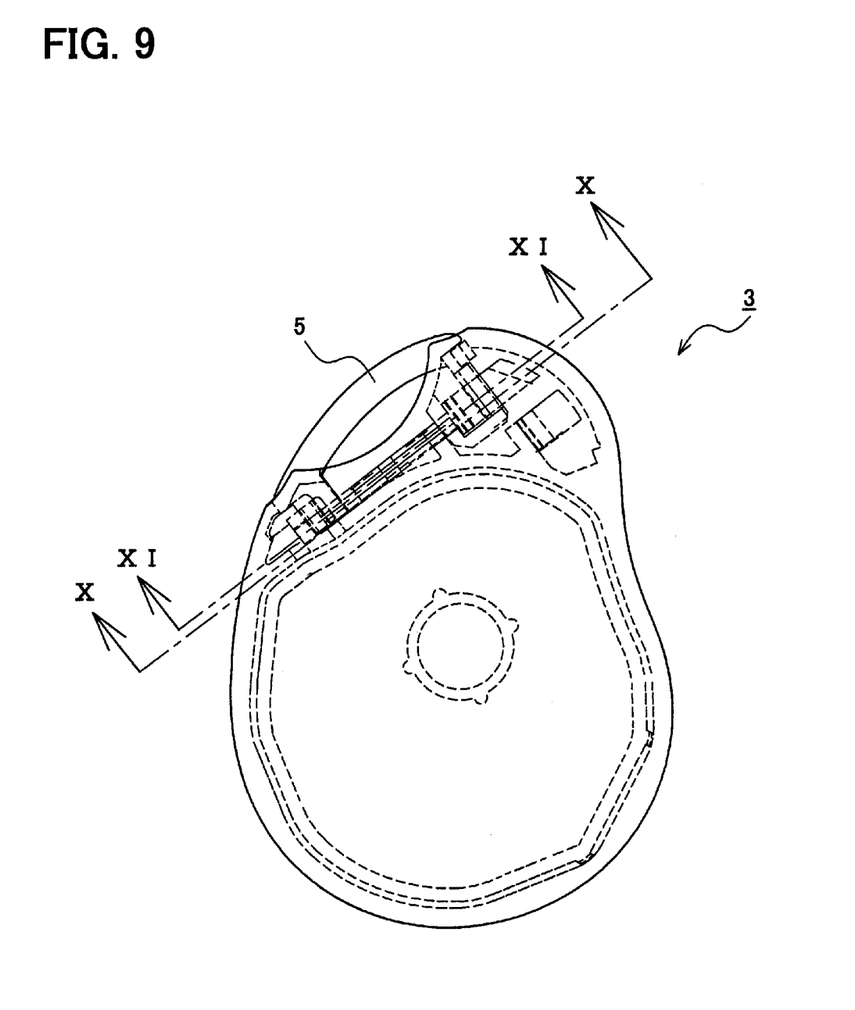
FIG. 9 is a plan view illustrating a housing according to the first embodiment.

As shown in FIG. 8, the first fixation structure 31a of the first casing 11 is a structure for fixing the key ring 5 to the first casing 11, and an engagement groove 83 to which the internal member 55 is fitted is provided between an outer wall 81 constituting the first concave portion 23a and the partition wall 33.

Parts 35a, 35b of the outer rim portion 35 of the first casing 11 to which both ends of the external member 53 are fitted are lower than the other part of the outer rim portion 35. Parts of the outer rim portion 47 of the second casing 9 to which both ends of the external member 53 are fitted are lower than the other part of the outer rim portion 47.

Figure 11:
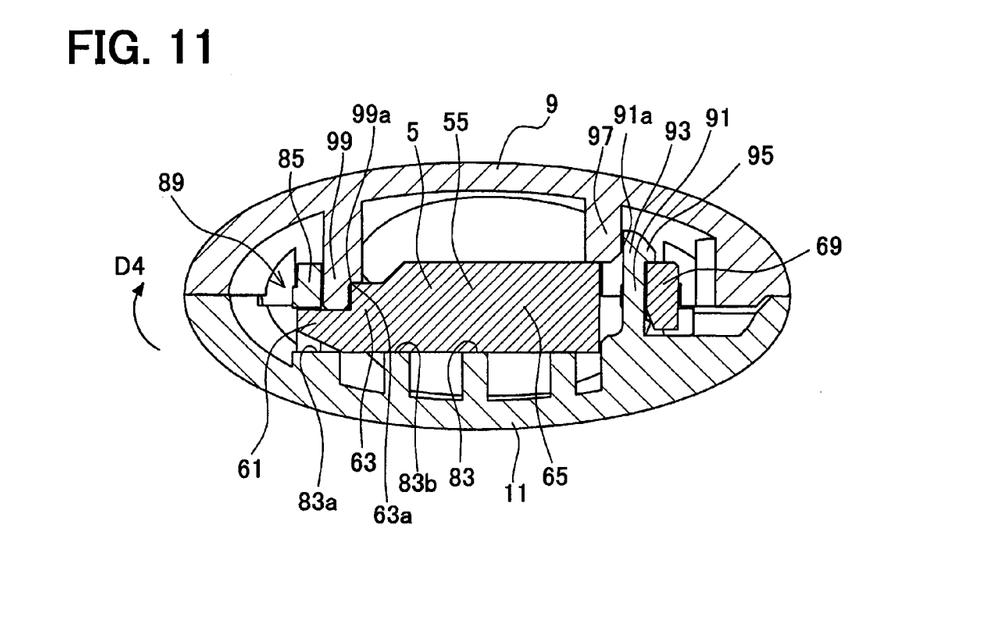
FIG. 11 is a cross-sectional diagram taken along XI-XI line of FIG. 9.

As shown in FIGS. 10 and 11, one end side (left side of FIG. 10) of the engagement groove 83 extends (to a tip groove 83a) such that the tip side engagement portion (first end) 61 on the one side of the internal member 55 is inserted into the engagement groove 83, and a bridge portion 85 (see FIGS. 8 and 11) extends across a part of an opening side (upper side of FIG. 10) of the tip groove 83a.

A protrusion portion 87 protruding upward in FIG. 10 is provided on the one end side of the partition wall 33, and the protrusion portion 87 constitutes the bridge portion 85 having a cuboid shape to extend perpendicularly across the tip end groove 83a, as shown FIG. 8. When the key ring 5 is fitted to the housing 3, an upper surface (upper surface in FIG. 10) of the tip side engagement portion 61 contacts the bridge portion 85.

As described above, the tip groove 83a and the bridge portion 85 constitute the first engagement portion 89 that limits the one end side (i.e. the tip side engagement portion 61) of the internal member 55 inserted into the tip groove 83a from moving in a direction away from the first casing 11. An opening portion 33a (see FIG. 10) that communicates with the tip groove 83a is provided in the partition wall 33.

A height of a bottom surface 83b of the engagement groove 83 is set to be a predetermined height such that lower surfaces (lower side in FIG. 10) of tip side engagement portion 61, the angular portion 63, and the center board portion 65 are in contact with the bottom surface 83b while the internal member 55 is fitted to the engagement groove 83. The interior member 55 (key ring 5) is provided along a predetermined direction (a direction parallel with an opening surface of the first casing 11).

A second engagement portion 91 that vertically extends from (stands on) the first casing 11 toward the second casing 9 is provided on the other side (right side in FIG. 10) of the engagement groove 83 of the first casing 11. The second engagement portion 91 has a board shape, and an engaging claw 95 that is engaged with an upper surface of the back side engagement portion 69 of the internal member 55 is provided at a tip portion 93 of the second engagement portion 91.

As shown in FIG. 8, the second engagement portion 91 is located in the space 51 encircled by the internal member 55 so as to be closer to the one end side (left side in FIG. 8) than the back side engagement portion 69. The second engagement portion 91 is provided in parallel with the back side engagement portion 69. Since the width of the second engagement portion 91 is larger than the engagement groove 83, the linkage portion 67 is bent into an L-shape to secure the width.

As shown in FIGS. 10 and 11, a back side limiting portion 97 that perpendicularly extends (stands) toward the first casing 11 is provided as a second fixation structure 31b. The back side limiting portion 97 has a board shape and is provided in parallel to a back surface (a surface on the one end side) 91a of the second engagement portion 91 so as to be close to or in contact with the back surface 91a.

A small gap (clearance) 98 is provided on a back surface 91a side of the second engagement portion 91. A lower end of the back side limiting portion 97 extends to be in contact with an upper surface of the center board portion 65 of the internal member 55.

A one end side limiting portion 99 perpendicularly extends from (stands on) an inner surface of the one end side (left side in FIG. 11) of the second casing 9 toward the first casing 11. A recess portion 99a at which the other end side of a tip of the one end side limiting portion 99 is cut off at right angle is provided, and the recess portion 99a is engaged with a corner (convex portion 63a) of a tip of the angular portion 63. One end side of a tip of the convex portion 63a may be curved at right angle.

Figure 12:
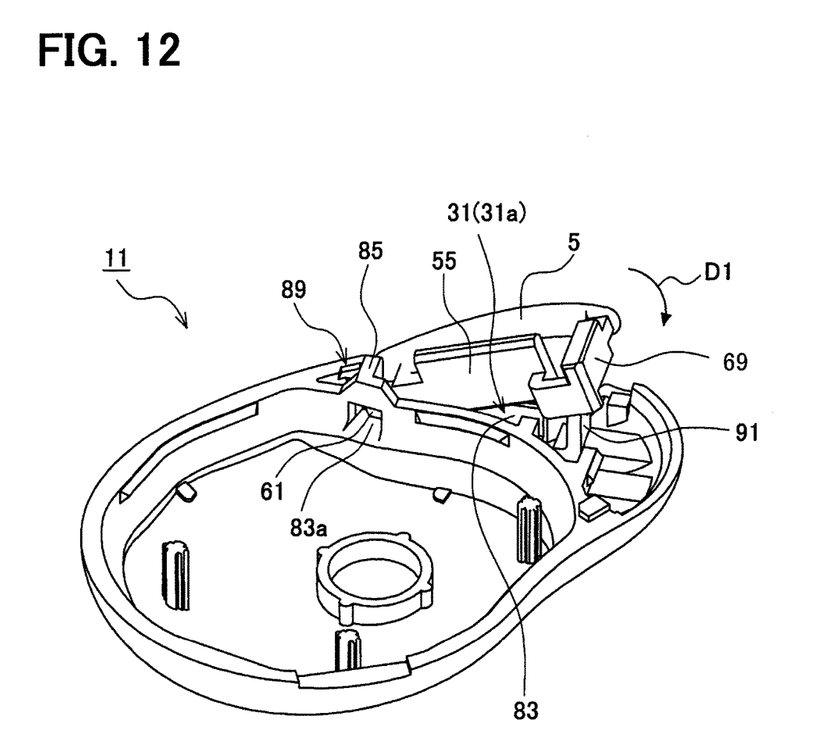
FIG. 12 is a perspective diagram illustrating the first casing and the key ring according to the first embodiment.

Next, a method for anchoring the key ring 5 will be described below. As shown in FIG. 12, when the key ring 5 is fixed to the first fixation portion 31a of the first casing 11, the tip side engagement portion 61 of the interior member 55 is inserted along the engagement groove 83 into the first engagement portion 89 that is constituted (to have a hole shape) by the tip groove 83a and the bridge portion 85.

Next, the other end side of the interior member 55 is rotated in a direction of arrow D1 such that the key ring 5 is turned over. Due to this rotation, the back side engagement portion 69 pushes the second engagement portion 91 (engaging claw 95), and the second engagement portion 91 is bent. When the key ring 5 is further rotated, the engaging claw 95 of the second engagement portion 91 climbs over the back side engagement portion 69 to be recovered, and accordingly the back side engagement portion 69 and the second engagement portion 91 are engaged with each other as shown in FIG. 10.

According to this, the key ring 5 is fixed to the first fixation structure 31a of the first casing 11. Subsequently, as shown in FIG. 10, the first casing 11 and the second casing 9 are integrated with each other by pushing the first casing 11 in a direction of arrow D2 (engagement direction) and pushing the second casing 9 accommodating the wireless communication device 7, for example, in a direction D3 (engagement direction).

The back side limiting portion 97 extending from the second casing 9 is disposed along the back surface 91a and is in contact with the upper end of the center board portion 65. The recess portion 99a of the one end side limiting portion 99 extending from the second casing 9 is located to be engaged with the convex portion 63a of the angular portion 63.

According to this, the key ring 5 is fixed to the first casing 11, and the first casing 11 and the second casing 9 are fitted to each other to form the housing 3, and the electronic key 1 for a vehicle including the key ring 5 is formed.

As described above, for snap-fit, the engaging claw 37 is provided in the first casing 11, and the engaging claw 49 is provided in the second casing 9. When the first casing 11 and the second casing 9 are fitted to each other, the engaging claws 37, 49 are engaged with each other, and accordingly the first casing 11 and the second casing 9 are surely fixed to each other. The snap-fit can be disassembled by exerting a force in an opposite direction from the engagement direction with a work tool, for example.

Next, effects of the first embodiment will be described below.

In the electronic key 1 for a vehicle according to the first embodiment, the key ring 5 is anchored to the housing 3 that is formed with the first casing 11 and the second casing 9 integrated with each other. The center board portion 65, for example, of the interior member 55 is inserted into the engagement groove 83 provided between the outer wall 81 and the partition wall 33.

The first casing 11 has a shape into which the tip side engagement portion 61 that is one end of the interior member 55 is inserted, and the first casing 11 includes the first engagement portion 89 that limits the tip side engagement portion 61 from moving in the direction away from the first casing 11. The first casing 11 includes the second engagement portion 91 limiting the back side engagement portion 69 that is the other end side of the interior member 55 from moving the direction away from the first casing 11 while the tip side engagement portion 61 is engaged with the first engagement portion 89.

Accordingly, when a clockwise (a direction of arrow D4) twisting force is exerted on the key ring 5 as shown in FIG. 10, the first engagement portion 89 of the first casing 11 limits the one end side (left side in FIG. 10) of the key ring 5 from rotating. Similarly, the bottom surface 11a of the first casing 11 limits the other end side (right side in FIG. 10) of the key ring 5 from rotating. According to this, the clockwise rotation of the key ring 5 is limited.

When a counterclockwise (a direction of arrow D5) twisting force is exerted on the key ring 5, the one end side (left side in FIG. 10) of the key ring 5 is held by the bottom surface 83b of the engagement groove 83 of the first casing 11, and accordingly the key ring 5 is not rotated. Similarly, the engaging claw 95 limits the other end side (right side in FIG. 10) of the key ring 5 from rotating. Accordingly, the counterclockwise rotation of the key ring 5 is limited.

Moreover, since the back side limiting portion 97 extending to the center board portion 65 along the back surface 91a of the second engagement portion 91 is provided in the second casing 9, the second engagement portion 91 and the center board portion 65 is unlikely to be moved (rotated) even when a large counterclockwise twisting force is exerted. Accordingly, the engaging claw 95 is unlikely to be disengaged from the back side engagement portion 69.

The second casing 9 includes the one end side limiting portion 99 that limits the one end side of the interior member 55 from moving in the direction (a direction of arrow D3) away from the first casing 11. When the counterclockwise force is exerted on the key ring 5, the convex portion 63a of the angular portion 63 contacts the recess portion 99a of the one end side limiting portion 99, and accordingly the rotation of the key ring 5 is limited. Accordingly, the disengagement of the key ring 5 is limited.

That is, the above-described configurations have remarkable effects that the key ring 5 is unlikely to be disengaged from the first casing 11, and the first casing 11 and the second casing 9 are unlikely disengaged from each other even when the twisting force is exerted on the key ring 5.

Since the key ring 5 is inserted into the engagement groove 83, a stress is received by a total extent of the wall surface (whole extend of the outer wall 81) of the engagement groove 83 while the twisting force is exerted on the key ring 5, and accordingly the configurations have a high tensile strength.

In the electronic key 1 for a vehicle according to the first embodiment, the disengagement of the key ring 5 is limited even when an outside force is exerted on the key ring 5 that protrudes from the housing 3.

According to the above-described configurations, the fixation of the key ring 5 is achieved with a small space, and the configurations are superior in strength. In the first embodiment, since the space in which the second engagement portion 91 is provided is large due to the linkage portion 67 of the interior member 55 bent in an L-shape, the width of the second engagement portion 91 can be large. Accordingly, the second engagement portion 91 and the back side engagement portion 69 can be engaged strongly with each other.

Since the key ring 5 is fixed to the first casing 11 by the first fixation structure 31a, the key ring 5 is not disengaged from the first casing 11 even when the first casing 11 and the second casing 9 is disengaged from each other at a time of battery change.

Since the exterior member 53 of the key ring 5 protrudes from the housing 3 so as to define a gap 51a (see FIG. 8) that is a part of the space 51, a strap, a ring and the like can be attached to the key ring 5.

Second Embodiment

Next, a second embodiment will be described below, but descriptions for parts similar to the first embodiment are omitted. Same numerals as the first embodiment are assigned to parts similar to the first embodiment.

Figure 13A:
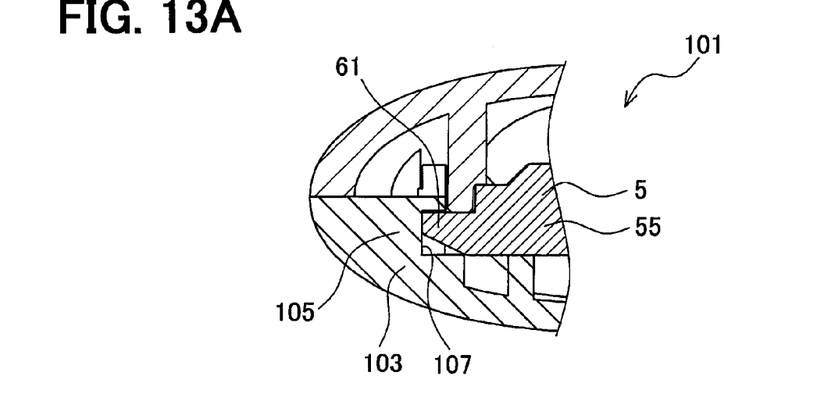
FIG. 13A is a cross-sectional diagram illustrating an electronic key for a vehicle according to a second embodiment.

As shown in FIG. 13A, in an electronic key 101 for a vehicle according to the second embodiment, a hole (recess portion) 107 that is open toward a right side of FIG. 13A is provided on one end side (left side in FIG. 13A) of a first casing 103 as a first engagement portion 105.

A tip side engagement portion 61 of an interior member 55 of a key ring 5 is inserted into the recess portion 107.

The second embodiment has the same effects as the first embodiment.

Third Embodiment

Figure 13B:
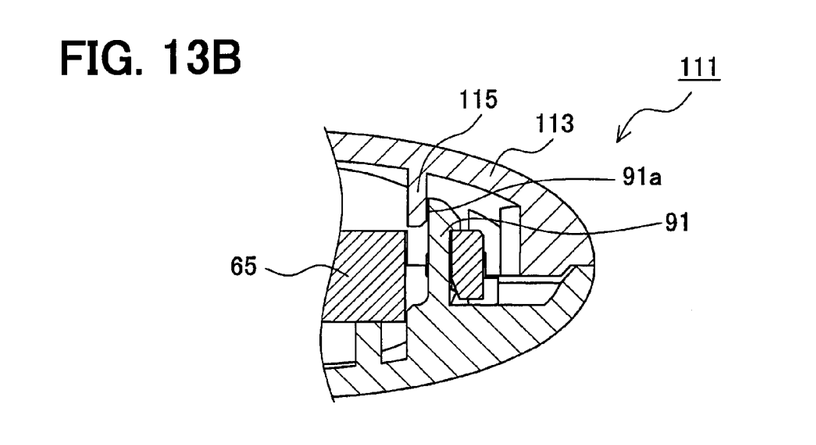
FIG. 13B is a cross-sectional diagram illustrating an electronic key for a vehicle according to a third embodiment.

As shown in FIG. 13B, in an electronic key 111 for a vehicle according to a third embodiment, a back side limiting portion 115 is provided on the other end side (right side in FIG. 13B) of a second casing 113. The back side limiting portion 115 extends along a back surface 91a of a second engagement portion 91 similarly to the first embodiment, but a tip (lower end) of the back side limiting portion 115 does not reach an upper end of the center board portion 65.

Although the strength against the twisting force is smaller than the first embodiment, the third embodiment has almost the same effects as the first embodiment.

Fourth Embodiment

Figure 13C:
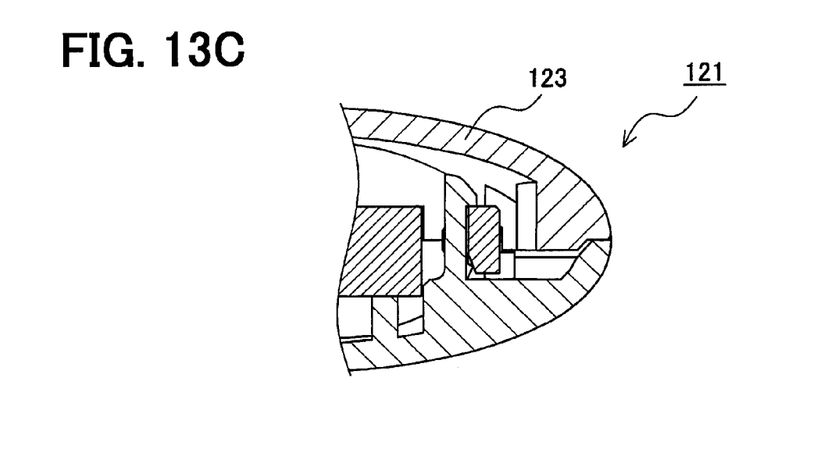
FIG. 13C is a cross-sectional diagram illustrating an electronic key for a vehicle according to a fourth embodiment.

As shown in FIG. 13C, in an electronic key 121 for a vehicle according to a fourth embodiment, a back side limiting portion is not provided on the other end side (right side in FIG. 13C) of a second casing 123. The other configurations are the same as the first embodiment.

Although the strength against the twisting force is smaller than the first embodiment, the fourth embodiment has almost the same effects as the first embodiment.

Although the present disclosure has been described in connection with the preferred embodiments thereof, it is to be noted that various changes and modifications will become apparent to those skilled in the art. The present disclosure includes various changes and modifications within the equivalent. Moreover, other combinations and configurations, including more, less or only a single element, are also within the spirit and scope of the present disclosure.

For example, the key ring may be fixed to the first casing or the second casing.

The present disclosure can be used for various usages such as an electronic key for a house, instead of the vehicle.

A function of one element of the above-described embodiments may be achieved with multiple elements. A function achieved with multiple elements may be achieved with one element. At least one element of the above-described embodiments may be replaced by a known configuration having the same function. A part of the above-described configurations of the above-described embodiments may be omitted. At least a part of the configurations of one of the above-described embodiments may be added to or replaced by the configuration of the other one of the above-described embodiments.

What is claimed is:

1. An anchoring structure for an annular member, the anchoring structure comprising:
a housing including a first casing and a second casing which are engaged and integrated with each other; and
the annular member, a part of the annular member being interposed between the first casing and the second casing, the annular member being anchored to the housing and protruding from the housing, wherein
the annular member includes
an external member that protrudes to an outside of the housing to define a gap between the external member and the housing, and
an internal member that is connected to the external member and is located on an inside of the housing, and
the first casing includes
a first engagement portion that has a shape into which a first end of the internal member is inserted, the first engagement portion limiting the first end of the internal member from moving in a direction away from the first casing, and
a second engagement portion limiting a second end of the internal member which is opposite from the first end from moving in the direction away from the first casing while the first end of the internal member is engaged with the first engagement portion, further comprising:

a back side limiting portion that extends from an inner surface of the second casing toward the first casing and limits the second engagement portion from moving toward the first end, wherein the back side limiting portion reaches a position where the back side limiting portion limits the second end of the internal member from moving in the direction away from the first casing.

2. The anchoring structure for the annular member according to claim 1, wherein the first engagement portion includes
a groove into which the first end is inserted, and
a bridge portion that covers a part of an opening side of the groove.

3. The anchoring structure for the annular member according to claim 1, wherein
the first engagement portion is a hole into which the first end is inserted.

4. The anchoring structure for the annular member according to claim 1, wherein
the second engagement portion extends from an inner surface of the first casing toward the second casing, and
an engaging claw engaged with the internal member is provided at a tip portion of the second engagement portion.

5. The anchoring structure for the annular member according to claim 1, further comprising:
a first end side limiting portion that extends from an inner surface of the second casing toward the first casing and limits the first end of the internal member from moving in the direction away from the first casing.

6. An electronic key, comprising:
the anchoring structure for the annular member according to claim 1, and
an electronic component accommodated in the housing.

* * * * *